United States Patent
Estebe et al.

(10) Patent No.: US 10,054,623 B2
(45) Date of Patent: Aug. 21, 2018

(54) CALIBRATION AND TESTING DEVICE FOR AN ACTIVE ANTENNA, PARTICULARLY A NOSE-CONE ANTENNA OF AN AIRBORNE RADAR

(75) Inventors: Eric Estebe, Paris (FR); Pierre Levy, Versailles (FR); Alain Bouedo, Fontenay-le-Fleury (FR)

(73) Assignee: THALES, Courbevoie (FR)

( * ) Notice: Subject to any disclaimer, the term of this patent is extended or adjusted under 35 U.S.C. 154(b) by 463 days.

(21) Appl. No.: 14/234,359

(22) PCT Filed: Jul. 19, 2012

(86) PCT No.: PCT/EP2012/064231
§ 371 (c)(1),
(2), (4) Date: Mar. 13, 2014

(87) PCT Pub. No.: WO2013/014065
PCT Pub. Date: Jan. 31, 2013

(65) Prior Publication Data
US 2014/0300519 A1    Oct. 9, 2014

(30) Foreign Application Priority Data
Jul. 22, 2011  (FR) ..................................... 11 02291

(51) Int. Cl.
*G01R 29/10* (2006.01)
*H01Q 3/26* (2006.01)
(Continued)

(52) U.S. Cl.
CPC .......... *G01R 29/105* (2013.01); *G01R 29/10* (2013.01); *G01S 7/4026* (2013.01); *H01Q 3/267* (2013.01);
(Continued)

(58) Field of Classification Search
CPC ......... G01R 29/105; H01Q 17/00; H01Q 1/28
(Continued)

(56) References Cited

U.S. PATENT DOCUMENTS

| | | | | |
|---|---|---|---|---|
| 3,165,742 A | * | 1/1965 | Taylor .................. | G01S 7/4017 342/169 |
| 3,290,598 A | * | 12/1966 | Thomas ............... | G01R 29/105 342/4 |

(Continued)

FOREIGN PATENT DOCUMENTS

| | | |
|---|---|---|
| EP | 0629865 A1 | 12/1994 |
| FR | 2434497 A1 | 3/1980 |

OTHER PUBLICATIONS

Emad F. Ali, "Electronic Warfare Testing at the Benefield Anechoic Facility", 1997 IEEE Autotestcon Proceedings, Sep. 22-25, 1997, pp. 232-243, IEEE, New York, NY, USA, XP010253024.

*Primary Examiner* — Dameon E Levi
*Assistant Examiner* — Ab Salam Alkassim, Jr.
(74) *Attorney, Agent, or Firm* — Baker & Hostetler LLP (57) ABSTRACT

A device includes a test enclosure defining a cavity forming an anechoic chamber, having a test probe placed inside the cavity. The cavity comprises an aperture against which the radiating surface of antenna is positioned. The device includes a microwave-frequency test signal generator and a receiver for microwave-frequency signal emitted by the antenna under test and for measuring its amplitude and its phase in relation to a reference. Depending on the depth of the cavity and the dimensions of the radiation pattern of a test probe, the device comprises one or more test probes placed in fixed positions in the cavity or a mobile probe that can be positioned in various locations of the cavity, the probe or probes being configured and arranged to illuminate the whole active surface of the antenna and that the radiation (Continued)

pattern of each radiating element illuminates at least one test probe.

12 Claims, 6 Drawing Sheets

(51) Int. Cl.
 *H01Q 17/00* (2006.01)
 *G01S 7/40* (2006.01)
(52) U.S. Cl.
 CPC ...... *H01Q 17/00* (2013.01); *G01S 2007/4086* (2013.01)
(58) Field of Classification Search
 USPC .......................................................... 342/2
 See application file for complete search history.

(56) References Cited

U.S. PATENT DOCUMENTS

| | | | | |
|---|---|---|---|---|
| 3,879,733 A * | 4/1975 | Hansen | ................ | G01R 29/10 342/360 |
| 4,218,683 A * | 8/1980 | Hemming | ............ | G01R 29/105 342/4 |
| 4,800,387 A * | 1/1989 | Joy | ........................ | G01R 29/10 342/165 |
| 4,998,112 A * | 3/1991 | Franchi | ................ | H01Q 3/267 342/360 |
| 5,117,230 A | 5/1992 | Wedel, Jr. et al. | | |
| 5,134,405 A * | 7/1992 | Ishihara | ................ | G01R 29/105 342/1 |
| 5,204,685 A * | 4/1993 | Franchi | ................ | G01R 29/10 342/360 |
| 5,260,513 A * | 11/1993 | Giles | ................... | G01R 29/105 174/390 |
| 5,432,523 A * | 7/1995 | Simmers | ................ | G01R 29/10 342/360 |
| 5,532,704 A * | 7/1996 | Ruelle | .................. | G01R 29/105 174/384 |
| 6,031,486 A * | 2/2000 | Anderson | ............... | B64G 7/00 342/165 |
| 6,329,953 B1 * | 12/2001 | McKivergan | .......... | G01R 29/10 343/703 |
| 6,784,670 B1 * | 8/2004 | Meloling | ........... | G01R 29/0821 324/627 |
| 6,842,013 B1 * | 1/2005 | Meloling | ........... | G01R 29/0821 324/627 |
| 6,961,021 B2 * | 11/2005 | Hisano | ..................... | H01Q 1/38 343/702 |
| 7,161,357 B2 * | 1/2007 | Lee | ..................... | G01R 29/0814 324/600 |
| 7,170,467 B1 * | 1/2007 | Town | ........................ | H01Q 1/50 343/703 |
| 7,477,877 B2 * | 1/2009 | Bednasz | ................ | G01R 29/10 343/702 |
| 7,667,467 B2 * | 2/2010 | Khosravi | ............... | G01R 27/28 324/601 |
| 8,228,247 B2 * | 7/2012 | Kitada | ................. | G01R 29/105 343/703 |
| 8,330,640 B2 * | 12/2012 | Liu | ..................... | G01R 29/0864 342/1 |
| 8,344,932 B2 * | 1/2013 | Liu | ........................ | H01Q 1/526 342/1 |
| 8,400,366 B2 * | 3/2013 | Kitada | ................. | G01R 29/105 343/703 |
| 9,121,874 B2 * | 9/2015 | Oh | ........................ | G01R 29/105 |
| 9,377,495 B2 * | 6/2016 | Chien | .................. | G01R 29/105 |
| 2004/0075443 A1 * | 4/2004 | Hemming | .......... | G01R 29/0821 324/637 |
| 2005/0059355 A1 * | 3/2005 | Liu | ..................... | H04B 17/3912 455/67.14 |
| 2006/0194553 A1 * | 8/2006 | Ozaki | ................. | G01R 29/10 455/226.1 |
| 2008/0024373 A1 * | 1/2008 | Khosravi | ............... | G01R 27/28 343/703 |
| 2008/0094294 A1 * | 4/2008 | Apostolos | ............. | H01Q 3/267 343/703 |
| 2008/0129615 A1 * | 6/2008 | Breit | .................... | G01R 29/105 343/703 |
| 2009/0219217 A1 * | 9/2009 | Kitada | ................. | G01R 29/105 343/703 |
| 2010/0171669 A1 * | 7/2010 | Ito | .......................... | G01R 29/10 343/703 |
| 2010/0207827 A1 * | 8/2010 | Oh | ........................ | G01R 29/10 343/703 |
| 2010/0238077 A1 * | 9/2010 | Cho | ...................... | H01Q 3/267 343/703 |
| 2012/0024622 A1 * | 2/2012 | Tuan | ..................... | B64D 33/02 181/214 |
| 2013/0249746 A1 * | 9/2013 | Oh | ........................ | G01R 29/105 343/703 |
| 2014/0128006 A1 * | 5/2014 | Hu | ........................ | H04B 17/15 455/73 |
| 2015/0048962 A1 * | 2/2015 | Ho | ........................ | H01Q 17/00 342/1 |
| 2017/0359739 A1 * | 12/2017 | Reed | ..................... | H04W 24/06 |

* cited by examiner

Fig. 1

2-a (view from above)  2-b (view from above)

Fig. 8  Test of antenna in emission

Fig. 9  Test of antenna in reception

Fig. 10  Test of antenna in emission

Fig. 11  Test of antenna in reception

CALIBRATION AND TESTING DEVICE FOR AN ACTIVE ANTENNA, PARTICULARLY A NOSE-CONE ANTENNA OF AN AIRBORNE RADAR

CROSS-REFERENCE TO RELATED APPLICATIONS

This application is a National Stage of International patent application PCT/EP2012/064231, filed on Jul. 19, 2012, which claims priority to foreign French patent application No. FR 1102291, filed on Jul. 22, 2011, the disclosures of which are incorporated by reference in their entirety.

FIELD OF THE INVENTION

The invention relates to the general field of the testing of proper operation and the calibration of active antennas. It deals more particularly with the actions for testing proper operation and calibration which are executed outside of the manufacturing process. These actions can be carried out after mounting the antenna on the equipment which uses this antenna, or else in an on-site verification process after repair of the antenna, in particular in the case of exchange of one or more of the active elements (or sub-arrays) of which it consists.

BACKGROUND

In the process for manufacturing an active antenna, the testing of proper operation of the antenna as well as its calibration generally represent final actions. These are relatively complex actions which sometimes require the implementation of significant means on account of the size of the manufactured antenna and the density of the active elements on the surface of the antenna.

In a known manner, use is generally made of means forming a measurements base, which means make it possible to carry out either near-field tests, having regard to the distance at which the measurement is performed, or far-field tests at a distance from the antenna such that the radiation pattern of the antenna is formed.

The test and calibration actions carried out in the near field, that is to say in a zone where the antenna pattern is not yet formed, generally require the installation of the antenna in an enclosure, an anechoic chamber, in such a way that the test signals received by the antenna are not impaired by spurious signals originating notably from the reflection of the signals emitted by the test system on structures surrounding the antenna under test.

The means used to carry out the tests of proper operation and the calibration of an antenna in the production phase generally comprise, in addition to the anechoic enclosure mentioned above, means for generating and radiating particular test signals making it possible to test the unitary or group operation of the various active elements constituting the antenna, as well as the overall operation of the antenna in the various envisaged modes of operation. They furthermore comprise measurement means which make it possible to compare the characteristics of the signal actually received by the antenna with those expected. These are therefore means which are consequent, efficacious and necessarily centralized in a given place.

Accordingly when repairing a fault with an antenna on a utilization site, such equipment is rarely employed, so that the testing of proper operation and the calibration of an antenna after a maintenance action are generally more cursory than those carried out in the factory, short of being able to deploy in each maintenance workshop the appropriate means.

To alleviate this relative lack of means it is possible to implement various known solutions.

A first solution consists, after repair, in having the test and the calibration of the antenna be performed by a centralized structure having the appropriate means, the production factory for example. However, such a procedure gives rise to non-negligible transport costs, especially for antennas of large size, and increases the equipment immobilization time. This is why the adoption of such a procedure is generally accompanied by a temporal spacing of the maintenance actions, the antennas considered being, for example, designed to operate in a degraded state for which certain active elements are faulty.

Another solution consists, after executing maintenance actions, in carrying out only simple tests and extrapolating the operating state and the calibration of the antenna on the basis of the results of these tests. However, such a procedure does not always make it possible, in a case where failure is noted with a test, to distinguish the precise cause of the malfunction recorded (i.e. the failed element at the origin of an erroneous test) so that it is sometimes necessary, when in doubt, to replace several elements of the antenna so as to be certain of remedying the problem at the origin of the unsuccessful test.

SUMMARY OF THE INVENTION

An aim of the invention is to propose a test system making it possible to carry out on site the tests of proper operation and the actions for calibrating an active antenna, in particular an active antenna of the type of those fitted to nose-cone radars, mounted on aircraft.

Another aim of the invention is to propose a solution making it possible to use the means of the radar on which the antenna is mounted as means for generating a test signal and to carry out the appropriate measurements, or else the antenna itself, if it has signal generation and reception functions as well as functions for measuring the amplitude and phase of the signal received.

For this purpose the subject of the invention is a test and calibration device for active antenna, comprising a plurality of active emission-reception elements arranged so as to form a radiating surface. Said device comprises:
 a measurement enclosure configured to be mounted in front of the radiating surface of the antenna on the structure supporting the antenna and in which is positioned a test probe able to collect and to radiate microwave-frequency electromagnetic signals,
 means for generating a microwave-frequency radioelectric test signal as well as means for performing the reception of a microwave-frequency radioelectric signal and for performing a vector measurement of the signal received.

The device according to the invention is characterized in that the measurement enclosure itself comprises:
 a wall forming a cavity provided with an aperture, the aperture being configured in such a way that the cavity is closed by the radiating surface of the antenna when the enclosure is mounted on the structure supporting the antenna;
 means making it possible to position the test probe inside the cavity in a given position;
 fixing means making it possible to carry out the mounting of the measurement enclosure on the structure supporting the antenna, these means being configured so as to ensure, after mounting, a known axial positioning of the measurement enclosure with respect to the radiating surface of the antenna.

According to the invention, the wall forming the cavity is covered on its internal face with elements absorbing radioelectric waves. Its external face is furthermore configured to form an electrical shielding.

According to a particular embodiment of the device according to the invention, suited to the testing of a radar active antenna mounted in the nose of an aircraft and placed under the hood forming the nose cone of said aircraft, the measurement enclosure fixing means are identical to the means making it possible to fix the hood on the front structure of the aircraft which supports the antenna.

According to a particular embodiment of the device according to the invention, the depth of the cavity defined by the measurement enclosure is determined so as to allow an intermediate-field or far-field measurement of the signal received by the test probe when one or more active elements of the antenna are emitting, having regard to the position of the test probe in the cavity.

According to a particular mode of the previous embodiment, the dimensions of the measurement enclosure are determined in such a way that, having regard to the position of the probe in the cavity, the distance of the probe from each of the active elements constituting the antenna is greater than $d^2/2\cdot\lambda$, d representing the size of the equivalent radiating aperture of an active element of the antenna or of a sub-array consisting of active elements.

According to a particular embodiment of the device according to the invention, the measurement enclosure is configured so as to define a cavity whose dimensions make it possible to position the test probe at a fixed position for which it covers the entirety of the active surface of the antenna and for which it is illuminated by the main lobe of the radiation pattern of each of the active elements constituting the antenna.

According to a particular embodiment of the device according to the invention, having regard to the depth D2 of the cavity defined by the measurement enclosure and to the dimensions of the pattern of the test probe used, the measurement enclosure comprises a plurality of test probes. Each probe is mounted on a means making it possible to position it inside the cavity in a known position. The number of test probes and the position of each of these probes are defined in such a way that the union of their radiation patterns covers the entirety of the active surface of the antenna and that each of the probes is illuminated by the main lobe of the radiation pattern of one or more active elements, or active sub-arrays, constituting the antenna.

According to a particular embodiment of the device according to the invention, having regard to the depth D2 of the cavity defined by the measurement enclosure and to the dimensions of the pattern of the test probe used, the test probe is mounted on positioning means configured so as to allow the positioning of the test probe at various positions inside the cavity. These positions are determined in such a way that, for each position, the test probe is illuminated by the main lobe of the radiation pattern of one or more active elements, or active sub-arrays, constituting the antenna and that the set of positions allows the probe to cover the set of active elements, or active sub-arrays, constituting the antenna.

According to a particular mode of the previous embodiment, the means making it possible to position the test probe inside the cavity are configured in such a way that when the measurement enclosure is fixed on the structure supporting the antenna the distance separating a test probe from each of the elements of the antenna that it covers differs, from a given theoretical value, by a discrepancy that is less than the discrepancy ΔL defined by:

$$\Delta L = (\Delta\varphi \cdot \lambda)/360$$

where Δφ represents the systematic phase error expressed in degrees.

In a particular embodiment, the means for generating a microwave-frequency radioelectric test signal and the means for performing the reception of a microwave-frequency radioelectric signal and for performing a vector measurement of the signal received consist of the radar equipment associated with the tested antenna.

As the device does not make it necessary to dismantle the antenna of the radar, neither therefore is it necessary to use external generation/reception means since those of the radar can be used and are naturally present. This saves time and space. Moreover, the measurements being made with the means of the radar, the calibration carried out also integrates the defects of the radar chain (necessarily present) thereby making it possible to improve the performance of the overall system.

The subject of the invention is also a test system comprising a radar equipped with an active antenna and a test and calibration device as claimed in any one of the preceding claims.

In a particular embodiment, the enclosure consists of a peripheral wall, defining a cavity, the enclosure comprising an aperture exhibiting sufficient dimensions such that the active face of the antenna can be placed at the entrance of the cavity without any hardware obstacle being placed between active face of the antenna and the interior of the cavity and in which the enclosure is arranged so as to be able to encompass the entirety of the antenna in such a way that the antenna (19) closes the aperture.

The subject of the invention is also a method for carrying out the testing of an active antenna in emission or in reception by means of the device according to the invention, in which the means for generating a microwave-frequency radioelectric test signal and the means for performing the reception of a microwave-frequency radioelectric signal and for performing a vector measurement of the signal received being constituted by the radar equipment associated with the tested antenna, in which:

a microwave-frequency test signal is produced, which is radiated inside the measurement enclosure by means of the emission chain of the radar or of the antenna under-test the reception and the demodulation of the signal picked up by reception means is performed by means of the radar reception chain, the signal picked up by the antenna under-test is digitized by means of the radar signal processing means or of the antenna under-test.

The subject of the invention is also a first method for carrying out the testing of an active antenna in emission by means of the device according to the invention, the means necessary for generating a microwave-frequency radioelectric test signal and the means necessary for performing the reception of a microwave-frequency radioelectric signal and for performing a vector measurement of the signal received being provided by the radar equipment associated with the tested antenna. According to this method:

a microwave-frequency test signal and a reference signal are produced by means of the radar emission chain. The test signal is thereafter radiated inside the measurement enclosure, via the antenna under test;

the reception and the demodulation of the signal picked up by the test probe on the one hand and of the reference signal on the other hand are performed separately, by means of the radar reception chain;

the relative amplitude and the relative phase of the signal picked up by the antenna under test are measured with respect to the amplitude and to the phase of the reference signal. This relative amplitude and phase are determined, after digitization of the two signals, by the radar signal processing means and compared with theoretical reference values.

The subject of the invention is also a method for carrying out the testing of an active antenna in reception by means of the device according to the invention, the means for generating a microwave-frequency radioelectric test signal and the means for performing the reception of a microwave-frequency radioelectric signal and for performing a vector measurement of the signal received being constituted by the radar equipment associated with the tested antenna. According to this method:

a microwave-frequency test signal is produced by means of the radar emission chain. The test signal is thereafter radiated inside the measurement enclosure, via the test probe;

the reception and the demodulation of the signal picked up by the antenna under test on the one hand and of the signal picked up by an auxiliary antenna secured to the antenna under test, the latter signal being considered to be reference signal, are performed separately, by means of the radar reception chain;

the relative amplitude and the relative phase of the signal picked up by the antenna under test are measured with respect to the amplitude and to the phase of the reference signal. This relative amplitude and phase are determined, after digitization of the two signals, by the radar signal processing means and compared with theoretical reference values.

The subject of the invention is also a second method for carrying out the of an active antenna in emission by means of the device according to the invention, the means for generating a microwave-frequency radioelectric test signal and the means for performing the reception of a microwave-frequency radioelectric signal and for performing a vector measurement of the signal received being constituted by the radar equipment associated with the tested antenna. According to this method:

a microwave-frequency test signal and a reference signal are produced by means of the radar emission chain. The test signal is radiated inside the measurement enclosure, via the antenna under test. The radiated test signal is obtained by transposing a test signal into intermediate frequency whose frequency is deduced, by frequency multiplication, from a reference clock which also serves as reference for the radar signal processing means;

the reception and the demodulation of the signal picked up by the test probe are performed by means of the radar reception chain;

the amplitude discrepancy and phase discrepancy of the signal picked up by the antenna under test are measured with respect to the reference clock, the amplitude and the phase of the picked-up signal being determined, after digitization, by the radar signal processing means and compared with theoretical reference values.

The subject of the invention is further a method for carrying out the testing of an active antenna in reception by means of the device according to the invention, the means for generating a microwave-frequency radioelectric test signal and the means for performing the reception of a microwave-frequency radioelectric signal and for performing a vector measurement of the signal received being constituted by the radar equipment associated with the tested antenna. According to this method:

a microwave-frequency test signal and a reference signal are produced by means of the radar emission chain. The test signal is radiated inside the measurement enclosure, via the test probe. The radiated test signal is obtained by transposing a test signal into intermediate frequency whose frequency is deduced, by frequency multiplication, from a reference clock which also serves as reference for the radar signal processing means;

the reception and the demodulation of the signal picked up by the antenna under test are performed by means of the radar reception chain;

the amplitude discrepancy and phase discrepancy of the signal picked up by the antenna under test are measured with respect to the reference clock. The amplitude and the phase of the measured signal are determined, after digitization, by the radar signal processing means and compared with theoretical reference values.

BRIEF DESCRIPTION OF THE DRAWINGS

The characteristics and advantages of the invention will be better appreciated by virtue of the description which follows, which description relies on the appended figures which represent.

DETAILED DESCRIPTION

The system according to the invention is described hereinafter in the document through its application to the testing and to the calibration of electronic-scanning active antennas for aircraft nose cone radar, for which it is particularly adapted. However this particular application is presented here by way of nonlimiting exemplary embodiment of the scope of the invention.

Generally, an electronic-scanning active antenna is an array antenna which comprises electronic devices allowing changes in the shape and the direction of the beam emitted (and of the beam received). Depending on their nature, these electronic devices (phase shifters, switches, filters) which are connected to the radiating elements, act on the shape, the direction, the frequency or the polarization of the radiated electromagnetic wave. Such antennas which can exhibit varied structures, are however classed, in a known manner, into two large families: so-called passive antennas and so-called active antennas.

An electronic-scanning active antenna is an antenna whose structure includes, in a known manner, devices for amplifying the signals emitted or received. Such an antenna forms an array of active elementary emission and reception paths, which can be combined in various ways. Subsidiarily its structure can also integrate electronic devices carrying out conventional functions such as frequency transposition or digital coding of the signals.

The adjustment and verification of the proper operation of active antennas generally include a so-called calibration phase.

Calibration consists firstly in measuring on the assembled antenna the amplitude and phase dispersions in emission or reception recorded on the various elementary paths of the antenna, these dispersions being due notably to the dispersions of the components forming these elementary active paths as well as to the dispersions of assembly. It thereafter consists in determining the appropriate amplitude and phase corrections to be applied to the various elementary active paths to compensate for these dispersions.

Figure 1:
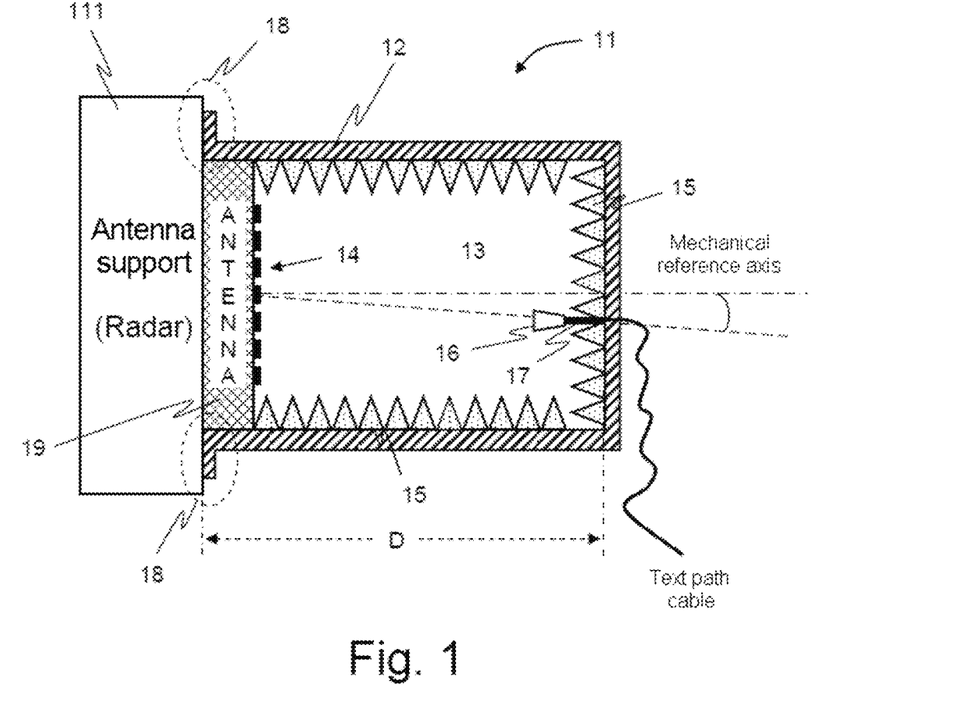
FIG. 1, a schematic illustration representing the structure and the composition of the enclosure of the device according to the invention.

To carry out the action of calibrating an active antenna the test system according to the invention comprises, as illustrated by FIG. 1, a test enclosure 11 which depending on the cases of use may be associated with various types of complementary means. The function of these complementary means is to generate a test signal. This test signal is emitted, according to case, either by a radiating element placed in the enclosure in proximity to the antenna and independent of the antenna, the latter then being tested in reception, or by the antenna itself, the latter then being tested in emission. The function of these complementary means is also to carry out the reception and the processing of the signals received, either by an antenna-independent sensor placed in the enclosure in proximity to the antenna and independent of the antenna, the latter then being tested in emission or by the antenna itself, the latter then being tested in reception.

For this purpose, the enclosure 11 consists of a peripheral wall 12, defining a cavity 13. According to the invention, the enclosure 11 comprises an aperture of sufficient dimensions such that the active face 14 of the antenna can be placed at the entrance of the cavity without any hardware obstacle being placed between active face of the antenna and the interior of the cavity 13. Advantageously, the enclosure is arranged so as to be able to encompass the entirety of the antenna 19 the antenna 19 in such a way that closes the aperture 19 as is represented in FIG. 1. This makes it possible to avoid radiation losses during the test as well as exterior disturbances. This also protects the operators from exterior leakages.

As illustrated by FIG. 1, the internal face of the wall 12 of the enclosure 11 is covered with a structure 15 absorbing the electromagnetic radiations which strike it. In this way, advantageously, only the direct radiations are considered.

The enclosure 11 also comprises a radiating element 16 mounted in the cavity 13 by way of a support 17. This radiating element 16 constitutes a test probe making it possible either to emit a signal toward the antenna 19, or to receive the signal emitted from the antenna 19. This radiating element can for example consist of a horn or of any other reciprocal radiating device.

According to a preferred embodiment of the invention, the enclosure 11 is configured so as to be able to be positioned in an automatic manner in a known, fixed relative position with respect to the antenna. In this way, insofar as the position of the probe in the enclosure 11 is known, the known fixed positioning of the enclosure with respect to the antenna makes it possible to ascertain at any instant the position of the probe 16 with respect to the plane of the antenna 14 facing the cavity 13. For this purpose the enclosure 11 comprises means making it possible to carry out its mounting in a precise position on the structure which supports the antenna during the trials undertaken. These means are, for example, disposed in the zone 18.

Figure 2:
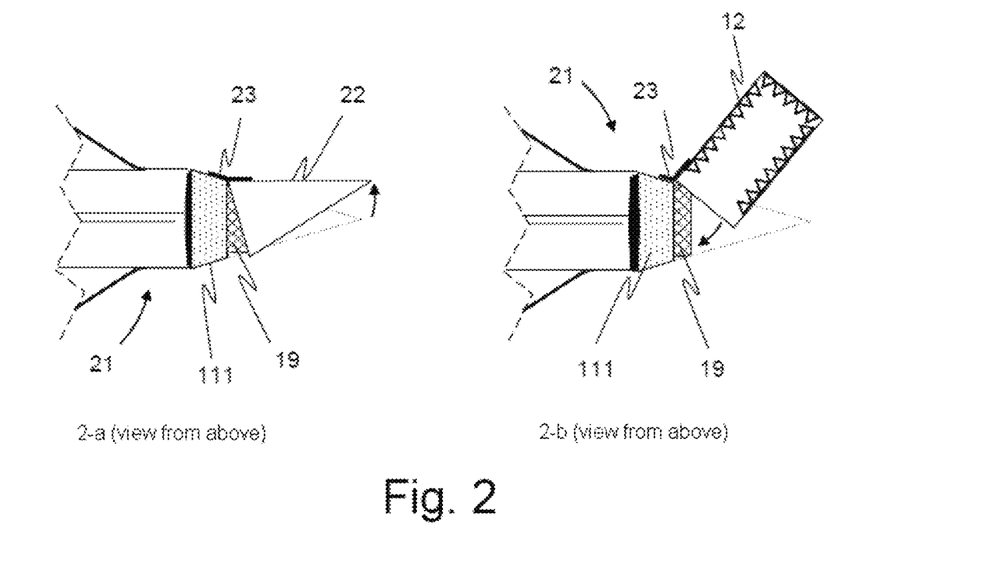
FIG. 2, a schematic illustration of a first implementation variant of the invention.

The illustrations 2-*a* and 2-*b* of FIG. 2 present schematic views (views from above) of a particular embodiment of the enclosure according to the invention, suited to the testing of an antenna 19 fitted to a nose cone radar 111 of an aircraft 21. The enclosure 11 is here preferably equipped with fixing means identical to those 23 making it possible to fix the hood 22, the radome, constituting the nose of the aircraft 21 on the structure supporting the radar and the antenna at the level of the aircraft. In this way, the means serving for the support of the radar and of the antenna during the workshop maintenance actions generally being provided with these same fixing means so as to be able to carry out trials of the radar integrating the hood, the enclosure according to the invention advantageously makes it possible to carry out tests on the antenna equally well when it is mounted on a workshop maintenance support as when it is still (or again) mounted on an airplane.

Alternatively, in the absence of the fixing means described above, the enclosure can be associated with any means making it possible to position the enclosure, and consequently the probe 16, opposite the antenna 19, in a position position and an orientation known with respect to the plane of the antenna.

According to the invention, the probe 16 is positioned in the cavity 13 in such a way as to occupy a known position with respect to the plane of the antenna 19 when the enclosure 11 is correctly positioned. The positioning of the probe is ensured by means suitable for guaranteeing the positioning precision required to allow the implementation of the tests of proper operation of the elements of the antenna as well as the angular calibration of the latter.

It is recalled at this juncture that the precision of amplitude and phase calibration of an antenna consisting of radiating elements is directly related to the prior knowledge of the transfer function between various radiating elements, taken separately or constituted into sub-arrays and the probe, this transfer function being able to be determined in a theoretical manner, through electromagnetic simulations, or else experimentally. It is also dependent on the precision of the amplitude and phase measurements carried out during calibration.

Now, the control of these transfer functions for a given position of the probe 16 with respect to the antenna plane 14, imposes certain constraints.

It is thus preferable to position the probe 16 in the intermediate-field or far-field zone remote from the radiating elements or sub-arrays grouping these elements together. Such remoteness does indeed make it possible to avoid the effects of overly fast variations of the radiated field as a function of position, effects that are encountered in the case of near-zone measurements. In this way, the effect of a slight error in positioning of the probe with respect to the envisaged position is advantageously less noticeable.

Thus according to the invention, the distance between each element (or sub-array) and the probe is, typically, chosen greater than $d2/(2 \cdot \lambda)$. d here represents the value of the radiating aperture equivalent to the element (or to the sub-array) considered and $\lambda$ the mean operating wavelength of the antenna.

Figure 3:
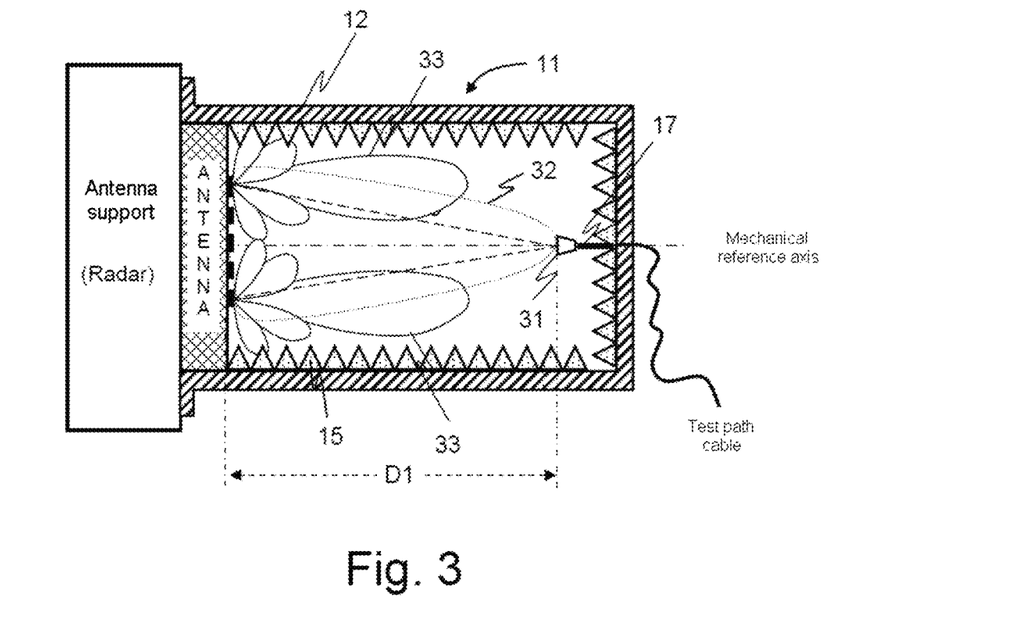
FIG. 3, a schematic illustration exhibiting a first embodiment of the means making it possible to radiate a test signal and to collect the signals emitted by the various elements of the antenna.

As illustrated by FIG. 3, it is likewise preferable, in order to obtain a sufficient and predictable level of transfer function, to position the probe 16 in such a way that its radiation pattern 31 intercepts the main lobe 32 radiated by each element (or sub-array).

Likewise also, it is preferable to use a probe, the radiation pattern of whose main lobe 31 intercepts the whole of the antenna for the distance D1 considered.

Figure 4:
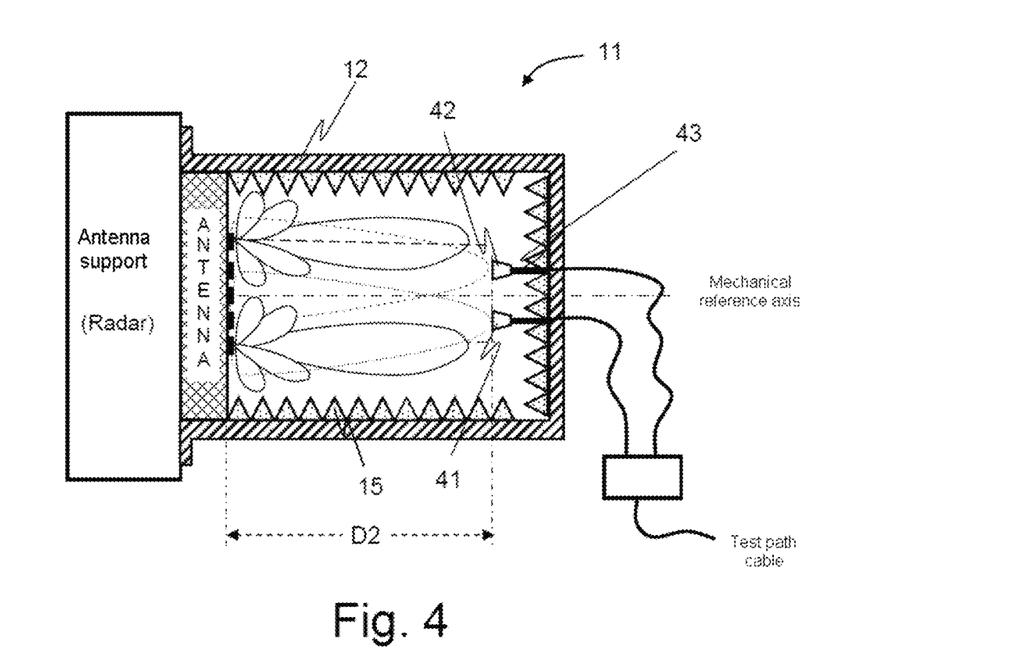
FIG. 4, a schematic illustration exhibiting a second embodiment of the means making it possible to radiate a test signal and to collect the signals emitted by the various elements of the antenna.

Alternatively, notably in the case where the antenna to be tested is of large size, or else in the case where the depth of the enclosure is more restricted or else in the case where the radiation pattern of the probe 16 used is more restricted, it is possible, as illustrated by FIG. 4, to implement several probes positioned in various locations, each probe being used to test a given portion of the antenna, that is to say some of the active elements constituting the antenna. In this case the various probes are disposed, preferably, in a plane a distance D2 away from the plane of the antenna, in such a way that each subset of active elements forming a given portion of the antenna is covered (i.e. illuminated) by the main lobe 41 of the radiation pattern of at least one of the probes and can, hence, be tested by means of this probe.

Moreover, insofar as the calculated transfer function corresponds to a given position of the probe considered with respect to the antenna plane, the obtaining of precise calibration measurements requires precise positioning of the probe 16 at the location for which the transfer function considered has been determined. Typically, positioning precision compatible with the precision of the amplitude-phase measurements which is sought for the calibration is notably obtained if the difference $\delta d$, between the actual distance between the probe and the antenna element (or the sub-array) considered and the distance considered to determine the transfer function, is less than the product $(\Delta\varphi_{max}\lambda)/360$, where $\Delta\varphi_{max}$ represents the permitted maximum error in the phase measurement expressed in degrees.

Concerning the precision of the calibration measurements, it is also recalled that the precision of amplitude and phase calibration of an antenna consisting of radiating elements also determines the control of the direction of pointing of the antenna, the antenna—probe axis having to be controlled with a better precision than the precision of angular harmonization sought for the antenna. It is recalled here that the angular harmonization precision corresponds to the precision with which the radioelectric axis of the antenna coincides with its mechanical axis.

According to the embodiment considered various positioning means are implemented.

According to a first embodiment illustrated by FIG. 3, a probe 31 exhibiting a sufficiently wide radiation pattern 32, non-directional, so that, having regard to the distance D1 separating the probe from the plane of the antenna, the whole of the radiating surface of the antenna 19 is covered is implemented for example by this pattern (i.e. illuminated) and that the probe 31 is illuminated by the main lobe of the pattern of each sub-array or of each radiating element to be tested.

In this first mode the probe 31 is placed in a fixed position inside the cavity 13. Accordingly it is fixed to the wall 12 of the enclosure by way of a rigid support 17. The dimensions of the enclosure 12, the depth D1 in particular, are moreover defined in such a way that the main lobe of the radiation pattern 33 of each of the radiating elements constituting the antenna encompasses the position of the probe. The radiation pattern of the probe 31 is for its part defined in such a way that the latter can illuminate the whole set of active elements constituting the antenna.

In this embodiment, the precise positioning of the probe 31 with respect to the plane of the antenna 19 under test is thus advantageously ensured on the one hand by the fixed tie linking the probe 31 to the enclosure 12 and on the other hand by the precise positioning and orientation of the enclosure with respect to this same antenna plane, which positioning and orientation are guaranteed by the use of the fixing means described above. In this particular embodiment the positioning of the probe is furthermore fixed.

This first embodiment, although advantageous, makes it necessary, however, to employ a probe positioned in such way that, having regard to its radiation pattern, it is capable of covering, on its own, the radiating surface of the antenna 19 and of being illuminated by the main lobe of the pattern of each sub-array or of each radiating element to be tested. Furthermore, this condition makes it necessary to employ an enclosure of a sufficient depth D. Now, this set of conditions is not necessarily simple to fulfill, so that, in order to alleviate the problems of illumination and of depth of the device, one is sometimes required to envisage alternative embodiments, such as those described hereinafter in the text.

According to a second embodiment, illustrated by FIG. 4, a plurality of probes (two probes 41 and 42 in the illustration of FIG. 4) is for example implemented. The number and the positions of the probes implemented are determined in such a way that each portion of the surface of the antenna 19 is covered by the radiation pattern of at least one probe and that the main lobe of the pattern of each sub-array or of each radiating element to be tested illuminates at least one of the probes.

In this second embodiment each of the probes 41, 42 is placed in a fixed position inside the cavity 13, at a distance D2 from the radiating surface of the antenna. Accordingly it is fixed to the wall 12 of the enclosure by way of a rigid support 43, of the same type as the support 17 mentioned above.

Figure 5:
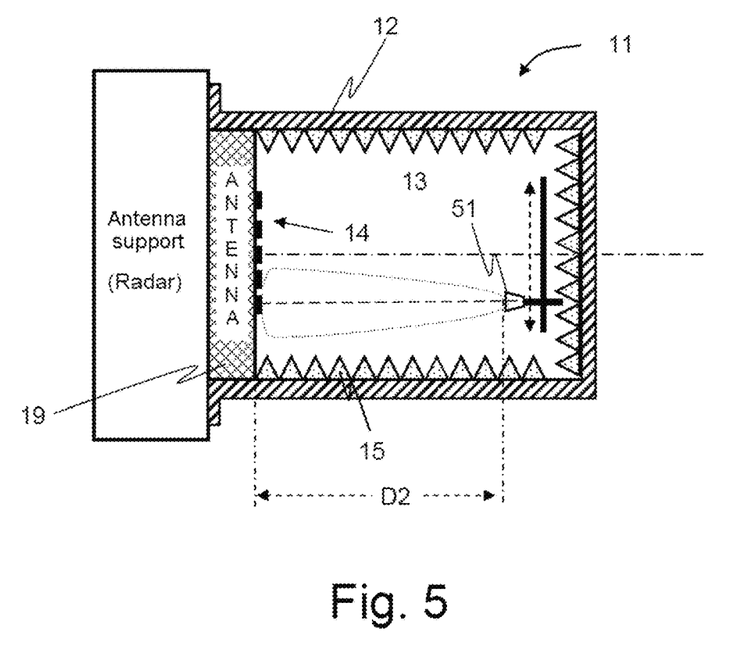
FIGS. 5 and 6, schematic illustrations exhibiting a third embodiment of the means making it possible to radiate a test signal and to collect the signals emitted by the various elements of the antenna.

According to a third embodiment, a single probe 51 is for example implemented, as illustrated by FIG. 5, mounted on means making it possible to make it move inside the cavity, in a plane parallel to the plane of the antenna, or along a given direction in this plane for example.

The amplitude of movement is defined in such a way that, having regard to the dimensions of the radiation pattern of the probe 51, the positions that it can occupy allow it to cover each portion of the surface of the antenna 19 and to be illuminated by the main lobe of the radiation pattern of each of the sub-arrays or radiating elements to be tested.

Figure 6:
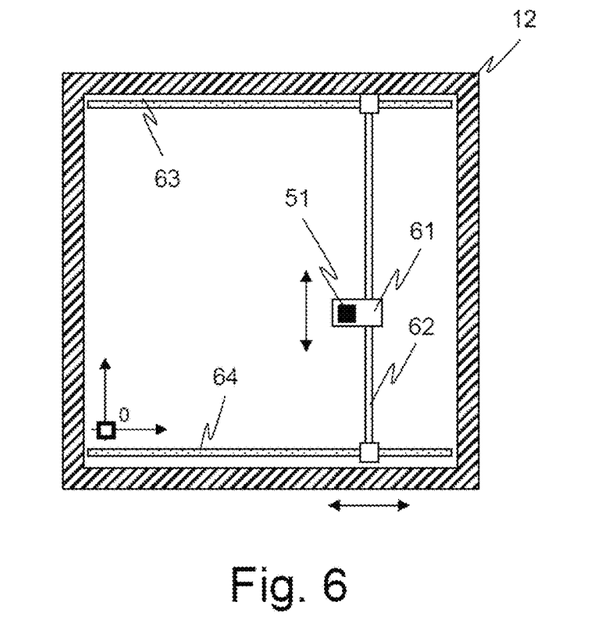

The means of movement are configured in such a way that the precise position of the probe with respect to a given reference point O is always known, the position of the reference point O being known precisely itself. FIG. 6 illustrates in a schematic manner an exemplary embodiment of such means, in which the probe 51 is mounted on a carriage 61, mobile in translation along a guide rod 62, itself guided in translation by two slideways 63 and 64 in a direction perpendicular to its axis. The various translation motions are impressed by motor means, not represented in the figure, configured to ensure precise control of the movement of the carriage and of the positioning in x and in y of the carriage 62, and therefore of the probe 51, with respect to the reference point O.

Figure 7:
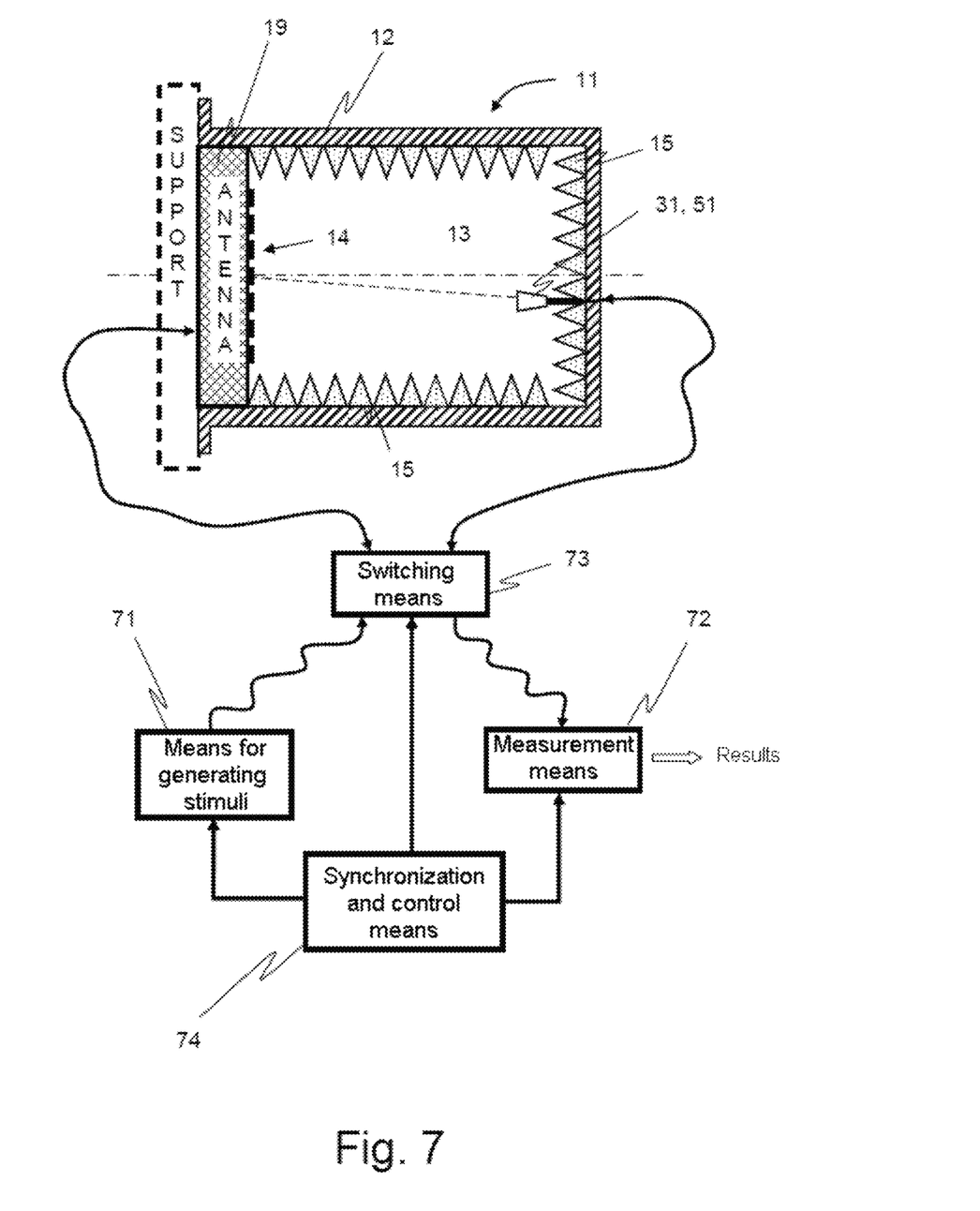
FIG. 7, a schematic diagram describing the means associated with the measurement enclosure for carrying out the tests of proper operation and for calibrating the antenna in emission or in reception.

According to the invention, the test enclosure described in the foregoing text is associated, as illustrated by the diagram of FIG. 7, with stimulation means 71 and measurement means 72. The object of the stimulation means 71 is to generate a test signal intended to be emitted either by the test probe 31 (or 51), or the test probes 41 and 42, placed in the enclosure 11, so as to carry out the test of the reception function of the antenna 19, or by the antenna 19 itself, so as to test the emission function of the antenna. The object of the measurement means 72 is, for their part, either to carry out the reception and the measurement of the signal received by the test probe 31 (or 51), or the test probes 41 and 42, placed in the enclosure 11 when carrying out the test of the emission function of the antenna, or to carry out the reception and the measurement of the signals received by the active elements constituting the antenna when carrying out the test of the reception function of the latter.

According to the invention, the nature and the shape of the signals constituting the stimuli, and also the processing applied to the signals received, depend mainly on the test carried out: test of proper operation of an active element or of a group of active elements of the antenna or calibration test, in emission or in reception.

Moreover, the stimulation means 71 and the measurement means 72 can consist of apparatuses specifically designed to carry out these tests, including off-the-shelf means configured in an appropriate manner. They are then hooked up to the antenna under test and to the test probe 31 (51), or to the test probes 41 and 42, with the aid of switching means 73 and orchestrated by appropriate synchronization and control means 74. The device according to the invention then integrates these stimulation and measurement means.

Alternatively, when the radar equipment associated with the tested antenna 19 comprises a test path, the stimulation and measurement functions can be carried out by using the radar itself.

Alternatively again if the antenna considered comprises signal generation and reception means as well as means for measuring the amplitude and phase of the signal received, the stimulation and measurement functions can be carried out using the antenna itself.

In a particular embodiment, the means for generating a microwave-frequency radioelectric test signal and the means for performing the reception of a microwave-frequency radioelectric signal and for performing a vector measurement of the signal received consist of the radar equipment associated with the tested antenna.

The subject of the invention is also a test system comprising a radar 111 equipped with an active antenna 19 and a test and calibration device for said antenna such as described above.

Hereinafter in the text are described two schemes, two methods, making it possible to carry out calibration and test measurements by means of the measurement enclosure 11 according to the invention and by implementing the technical means of the radar to carry out the stimulation and measurement functions. The radar is assumed here to be a coherent Doppler radar making it possible to carry out amplitude and phase measurements of the signal received.

In the two methods described, the wave emitted is generated by a frequency synthesizer at medium frequency and then transposed to microwave-frequency. Moreover the wave received is baseband demodulated by the local transposition oscillators arising from the synthesizer. The measurements are performed in emission and in reception since the transfer function is different.

Figure 8:
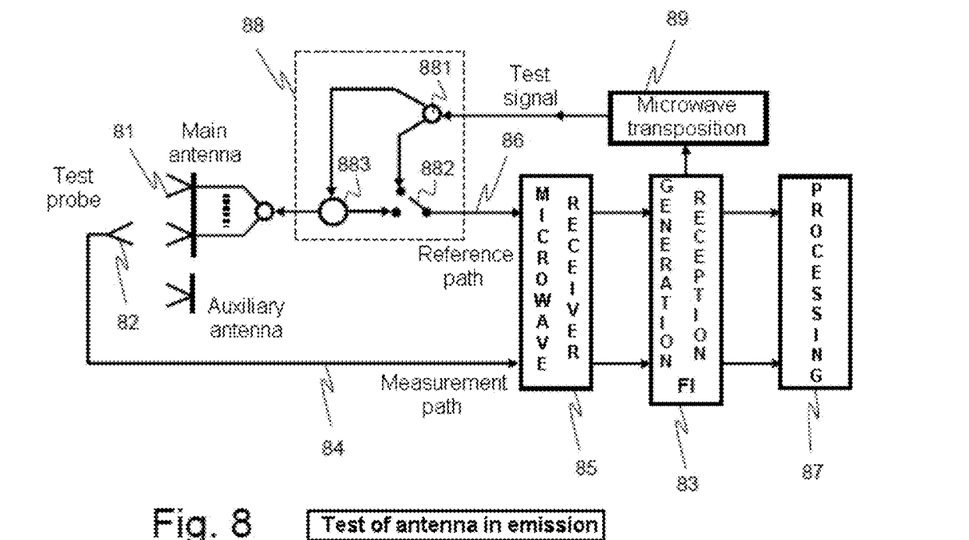
FIG. 8, a schematic diagram of a measurement in emission with respect to a reference path.
Figure 9:
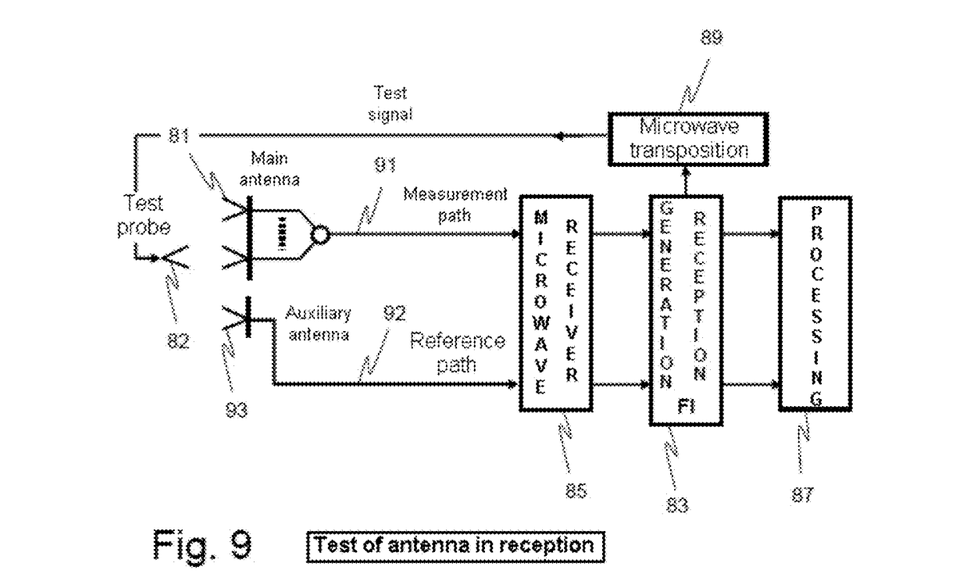
FIG. 9, a schematic diagram of a measurement in reception with respect to a reference path which may be either the auxiliary path of the antenna or a coupling of the test signal.

The first method is illustrated by FIGS. 8 and 9. It consists, in a conventional manner, in comparing the signals to be measured with a known reference signal.

FIG. 8 presents the hardware configuration corresponding to the use of the technical means of the radar within the framework of the first method, for the emission test of one or more active elements of the antenna, this test obviously being equally able to cover the testing of a single element 81 or that of the complete antenna 19.

In accordance with this first method, the signal arising from the synthesizer integrated into the radar IF generation and reception means 83 is transposed to microwave-frequency (a microwave transposition 89) and emitted by the various radiating elements 81 under test. The radiated signal is for its part tapped off by the test probe 82 of the measurement enclosure 11 according to the invention and transmitted to the receiver 85 of the radar, via a first reception path 84 or measurement path, while ensuring control of the possible decouplings and leakages. The measurement path is either the main reception processing path of the radar or a deviometry measurement path or another auxiliary path.

Furthermore, in order to have a permanent phase reference for all the paths, a part of the emission signal is steered toward the receiver 85 by a second reception path 86 or reference path, which is one of the radar reception paths (deviometry path or auxiliary path).

In order to be able to adopt such a measurement configuration, the measurement enclosure according to the invention is associated with appropriate switching means 88 such as those illustrated in FIG. 8. These means consist for example of a power coupler 881 (3 dB coupler), of a switch 882, and of an isolating and steering element 883, of circulator type for example, these elements being themselves previously calibrated so as to ascertain the phase shift and the attenuation that they introduce into the measurement chain.

Accordingly, after baseband demodulation, the radar processing means 87 carry out a spectral decomposition of the signals transmitted by the reception paths 84 and 86, by Fast Fourier Transform [FFT] of the 2 signals for example, and measure their vector difference.

It should be noted that in this embodiment, the baseband wave is shifted in frequency at the level of the emitted wave by a value of the order of a few Kilohertz with respect to the reception which is the baseband-processed frequency.

FIG. 9 presents the hardware configuration corresponding to the use of the technical means of the radar within the framework of the first method, for the test in reception of one or more active elements 81 of the antenna, this test obviously being equally able to cover the test of a single element 81 or that of the complete antenna 19.

In accordance with this first method, the signal arising from the synthesizer integrated into the radar IF generation and reception means 83 is transposed to microwave-frequency and emitted by the test probe 82 of the measurement enclosure 11.

The signal radiated by the test probe 82 is received by each radiating element 81 or group of radiating elements and transmitted to the receiver 85 on the one hand by the main reception path 91 (measurement path) and on the other hand by an auxiliary reception path 92 (reference path) associated with an auxiliary antenna 93 which can consist of a particular active element of the antenna. The auxiliary reception path 92 here constitutes the phase reference required for the measurements.

Accordingly, after baseband demodulation, the radar processing means 87 carry out a spectral decomposition of the signals transmitted by the reception paths 91 and 92, by Fast Fourier Transform [FFT] of the 2 signals for example, and measures their vector difference. The vector measurement of amplitude and phase between the various radiating elements or groups of radiating elements is thus carried out as for the tests in emission, by comparison of the signals received with the reference path 92.

Figure 10:
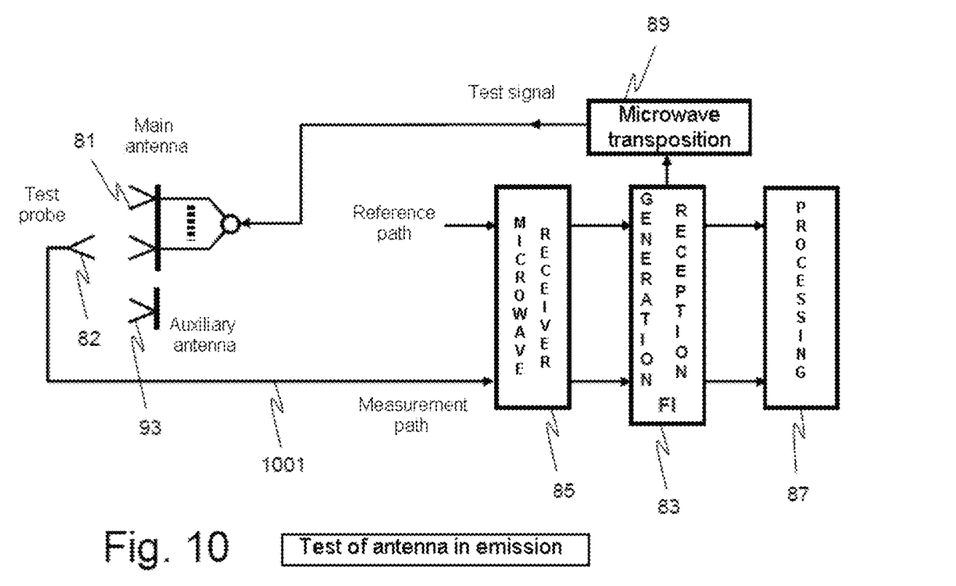
FIG. 10, a schematic diagram of a measurement in emission using the doppler signal, synchronous with the measurement period, so as to circumvent a reference path.
Figure 11:
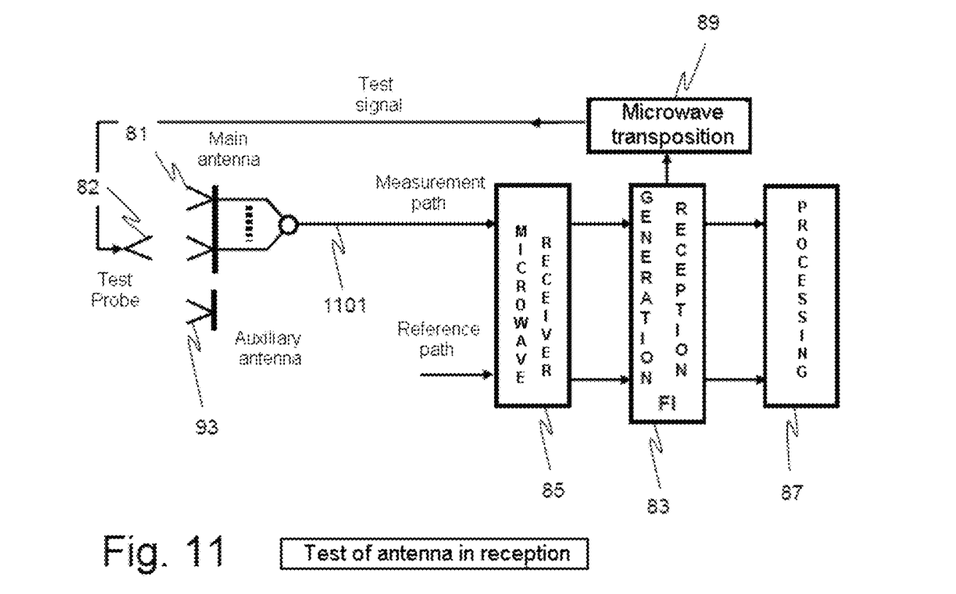
FIG. 11, a schematic diagram of a measurement in reception using the doppler signal, synchronous with the measurement period, so as to circumvent a reference path.

The second method presented is illustrated by FIGS. 10 and 11. The advantageous character of this second method consists in that, in contradistinction to the method described above, it does not require the use of a reference path to carry out measurements in emission or in reception.

The innovation here consists in rendering the measured signal synchronous with the temporal reference which regulates the spectral analysis, carried out by FFT. The measured signal is here the microwave-frequency signal transmitted to the receiver of the radar and transposed to baseband and then digitized, this signal being either the signal 1001 picked up by the measurement probe 82 (test of the antenna in emission), or the signal 1001 received by one or more active elements 81 of the antenna (test of the antenna in reception). Accordingly, the period of the temporal reference being equal to T, the synthesizer of the radar IF generation and reception means 83 is configured so as to synthesize a test wave of period equal to N×1/T. Thus, over time, the baseband wave generated by the synthesizer can be considered to be a phase reference for the signals obtained after spectral decomposition.

FIG. 10 presents the hardware configuration corresponding to the use of the technical means of the radar within the framework of the second method, for the emission test of one or more active elements of the antenna, this test obviously being equally able to cover the test of a single element 81 or that of the complete antenna 19.

The signal arising from the synthesizer integrated into the radar IF generation and reception means 83 is emitted by the various radiating elements 81. This signal is tapped off by the test probe 82 of the measurement enclosure 11 and transmitted via a reception path 104, or measurement path, to the receiver 85 of the radar.

Accordingly, after baseband demodulation, the radar processing means 87 carry out a spectral decomposition of the signal transmitted by the reception path 104, by Fast Fourier Transform [FFT] for example, and directly measures the absolute vector value.

Advantageously, as illustrated by FIG. 10, in order to be able to adopt such a measurement configuration, it is not necessary to associate particular switching means which are complementary with the measurement enclosure 11 according to the invention.

FIG. 11 presents the hardware configuration corresponding to the use of the technical means of the radar within the framework of the second method, for the test in reception of one or more active elements 81 of the antenna, this test obviously being equally able to cover the test of a single element 81 or that of the complete antenna 19.

In accordance with this second method, the signal arising from the synthesizer of the radar IF generation and reception means 83 is transposed to microwave-frequency and emitted by the test probe 82 of the measurement enclosure 11.

The signal radiated by the test probe 82 is received by each radiating element 81 or group of radiating elements and transmitted to the receiver 85 on the one hand by the single main reception path 111, or measurement path. The auxiliary antenna 93 is not used here, insofar as no external phase reference is required.

Accordingly, after baseband demodulation, the radar processing means 87 carry out a spectral decomposition of the signal transmitted by the reception path 111 (measurement path), by Fast Fourier Transform [FFT] for example. The vector measurement of amplitude and phase is thus carried out in a direct manner just as for the emission tests.

It should be noted that these two methods of measurement can of course be implemented equally well using a measurement enclosure comprising a single probe, such as that illustrated by FIGS. 3 and 5, as a measurement enclosure comprising several probes, such as that illustrated by FIG. 4.

The invention claimed is:

1. A test system for testing and calibrating an active antenna (19) in a zone where an antenna pattern is not yet formed, the test system comprising:

said active antenna (19), said active antenna including a plurality of active emission-reception elements arranged to form a radiating surface (14), a measurement enclosure (11) configured to be mounted in front of the radiating surface (14) of the active antenna on a structure (111) supporting the active antenna, in said measurement enclosure (11) is positioned at least one test probe (16) configured to collect and to radiate microwave-frequency electromagnetic signals, wherein the measurement enclosure (11) comprises:

a wall (12) forming a cavity (13) provided with an aperture, the aperture being configured such that the cavity is closed by the radiating surface (14) of the active antenna when the measurement enclosure (11) is mounted on the structure (111) supporting the active antenna;

means for positioning the test probe inside the cavity for a given position of the test probe relative to said active antenna; and fixing means (23) to carry out a mounting of the measurement enclosure (11) on the structure (111) supporting the active antenna, said fixing means being configured to ensure, after said mounting, a known axial positioning of the measurement enclosure (11) with respect to the radiating surface (14) of the active antenna, the wall (12) forming the cavity (13) being covered on an internal face with elements (15) absorbing electromagnetic waves, an external face of the wall (12) being configured to form an electrical shielding, the test system further comprising:

a plurality of test probes in the measurement enclosure wherein, with respect to a depth D2 of the cavity (13) defined by the measurement enclosure (11) and with respect to dimensions of a pattern of the test probe used, each probe of the plurality of test probes being mounted on a means (43) for positioning said each test probe inside the cavity (13) in a known position, a number of said test probes and a position of said each test probe of said plurality of probes being defined such that a union of respective radiation patterns of each of said test probes covers an entirety of the radiating surface (14) of the active antenna (19) and that said each of the test probes (41, 42) is illuminated by a main lobe of the radiation pattern of one or more active elements, or active sub-arrays, constituting the active antenna (19), dimensions of the measurement enclosure (11) being determined such that, with respect to at least one position of said each probe (16) in the cavity (11), the distance of said each test probe from each of the active elements or the sub-array of active elements constituting the active antenna is greater than $d^2/2\lambda$, d representing a size of an equivalent radiating aperture of an active element of the active antenna (19) or of the sub-array of active elements and $\lambda$ being a mean operating wavelength of the active antenna, and such that the number of said test probes and each position of the plurality of positions of said test probe being defined such that the radiation pattern of the test probe in each position covers a portion of the radiating surface (14) of the active antenna (19) without covering the entirety of the radiating surface (14) of the active antenna.

2. The test system as claimed in claim 1, wherein the positioning means (61-64) to position said each test probe (51) inside the cavity (13) are configured in such a way that when the measurement enclosure (11) is fixed on the structure (111) supporting the active antenna, the distance separating said each test probe (51) from each of the elements of the active antenna (19) that the test probe (51) covers differs, from a theoretical value of the distance, by a discrepancy that is less than a discrepancy $\Delta L$ defined by:

$$\Delta L=(\Delta\varphi\cdot\lambda)/360,$$

$\Delta\varphi$ representing a systematic phase error expressed in degrees.

3. The test system as claimed in claim 1, in which the measurement enclosure (11) consists of a peripheral wall (12), defining a cavity (13), the measurement enclosure (11) comprising an aperture exhibiting sufficient dimensions so that the radiating surface (14) of the active antenna can be placed at an entrance of the cavity without any hardware obstacle being placed between the radiating surface of the active antenna and an interior of the cavity (13) and in which the measurement enclosure is arranged to encompass an entirety of the active antenna (19) such that the active antenna (19) closes the aperture of the measurement enclosure (11).

4. A method for testing of an active antenna (81) in an emission or in a reception using a test and calibration device, said active antenna belonging to a test system having a radar equipment (111) associated with the tested active antenna (19), the test system including:

said active antenna (19), said active antenna including a plurality of active emission-reception elements arranged to form a radiating surface (14), a measurement enclosure (11) configured to be mounted in front of the radiating surface (14) of the active antenna on a structure (111) supporting the active antenna, in said measurement enclosure (11) is positioned at least one test probe (16) configured to collect and to radiate microwave-frequency electromagnetic signals, wherein the measurement enclosure (11) comprises:

a wall (12) forming a cavity (13) provided with an aperture, the aperture being configured such that the cavity is closed by the radiating surface (14) of the active antenna when the measurement enclosure (11) is mounted on the structure (111) supporting the active antenna;

means for positioning the test probe inside the cavity for a given position of the test probe relative to said active antenna; and fixing means (23) to carry out a mounting of the measurement enclosure (11) on the structure (111) supporting the active antenna, said fixing means being configured to ensure, after said mounting, a known axial positioning of the measurement enclosure (11) with respect to the radiating surface (14) of the active antenna, the wall (12) forming the cavity (13) being covered on an internal face with elements (15) absorbing electromagnetic waves, an external face of the wall (12) being configured to form an electrical shielding, a plurality of test probes in the measurement enclosure wherein, with respect to a depth D2 of the cavity (13) defined by the measurement enclosure (11) and with respect to dimensions of a pattern of the test probe used, each test probe of the plurality of test probes being mounted on a means (43) for positioning said each test probe inside the cavity (13) in a known position, a number of test probes and a position of said each probe of said plurality of probes being defined such that a union of respective radiation patterns of each of said test probes covers an entirety of the radiating surface (14) of the active antenna (19) and that said each of the probes (41, 42) is illuminated by a main lobe of the radiation pattern of one or more active elements, or active sub-arrays, constituting the active antenna (19), and such that the number of said test probes and each position of the plurality of positions of said test probe being defined such that the radiation pattern of the test probe in each position covers a portion of the radiating surface (14) of the active antenna (19) without covering the entirety of the radiating surface (14) of the active antenna dimensions of the measurement enclosure (11) being determined such that, with respect to at least one position of said each probe (16) in the cavity (11), the distance of said each test probe from each of the active elements or the sub-array of active elements constituting the active antenna is greater than $d^2/2\lambda$, d representing a size of an equivalent radiating aperture of an active element of the active antenna (19) or of the sub-array of active elements and $\lambda$ being a mean operating wavelength of the active antenna, the method comprising:

providing the active antenna (19) in the radar equipment (111), producing a microwave-frequency test signal radiated inside a measurement enclosure (11) by means of a radar emission chain, receiving and demodulating a signal picked up by reception means using the radar reception chain, and digitizing the signal picked up by the active antenna under-test by means of radar signal processing means.

5. The method for carrying out the testing of an active antenna (81) in emission as claimed in claim 4, wherein the microwave-frequency test signal and a reference signal are produced by means of the radar emission chain, the test signal being radiated inside the measurement enclosure (11), via the active antenna under test (81);

wherein said receiving and demodulating of the signal picked up by the test probe (82) and of the reference signal are performed separately by means of the radar reception chain; and wherein a relative amplitude and a relative phase of the signal picked up by the active antenna under test (19) are measured with respect to an amplitude and to a phase of the reference signal, respectively, said relative amplitude and phase being determined, after digitization of the signal and the reference signal, by the radar signal processing means (87) and compared with theoretical reference values.

6. The method for carrying out the testing of an active antenna (81) in reception as claimed in claim 4 further comprising:

producing the a microwave-frequency test signal by means of the radar emission chain, the test signal being radiated inside the measurement enclosure (11), via the test probe (82);

the receiving and the demodulating of the signal (91) picked up by the active antenna under test (81) and of the reference signal (92) picked up by an auxiliary antenna (93) secured to the active antenna under test (81), are performed separately by means of the radar reception chain, wherein the relative amplitude and the relative phase of the signal (91) picked up by the antenna under test are measured with respect to the amplitude and to the phase of the reference signal (92), said relative amplitude and phase being determined, after digitization of the signal and the reference signal, by the radar signal processing means (87) and compared with theoretical reference values.

7. The method for carrying out the testing of an active antenna (81) in emission as claimed in claim 4, further comprising:

producing the microwave-frequency test signal and a reference signal by means of the radar emission chain, the test signal being radiated inside the measurement enclosure (11), via the antenna under test (81), the test signal being obtained by transposing the test signal to an intermediate frequency whose frequency is deduced, by frequency multiplication, from a reference clock which also serves as a reference for the signal processing means (87) of the radar (111);

receiving and demodulating a signal (1101) picked up by said each test probe (82) are performed by means of the radar reception chain;

an amplitude and a phase discrepancy of the signal (1101) picked up by the active antenna under test (81) are measured with respect to the reference clock, the amplitude and the phase of the picked-up signal (1101) being determined, after digitization, by the signal processing means (87) of the radar (111) and compared with theoretical reference values.

8. The method for carrying out the testing of an active antenna (81) in reception as claimed in claim 4, further comprising:

producing the microwave-frequency test signal and a reference signal by means of the radar emission chain, the test signal being radiated inside the measurement enclosure (11), via each said test probe (82), the test signal being obtained by transposing the test signal to an intermediate frequency whose frequency is deduced, by frequency multiplication, from a reference clock which also serves as a reference for the signal processing means (87) of the radar (111);

receiving and demodulating a signal (1101) picked up by the active antenna under test (81) are performed by means of the radar reception chain;

an amplitude and a phase discrepancy of the signal (1101) picked up by the active antenna under test (81) are measured with respect to the reference clock, the amplitude and the phase of the measured signal being determined, after digitization, by the signal processing means (87) of the radar and compared with theoretical reference values.

9. The test system as claimed in claim 1, wherein the active antenna to be tested is a radar antenna mounted in a nose of an aircraft and placed under a hood (22) forming a nose cone of said aircraft, and including a measurement enclosure fixing means (23) identical to means to fix the hood on a front structure of the aircraft which supports the active antenna.

10. The test system as claimed in claim 1, wherein a depth of the cavity (13) defined by the measurement enclosure (11) is determined so as to allow an intermediate-field or a far-field measurement of the signal received by the test probe (16) when the one or more active elements of the active antenna (19) are in emission, having regard to the position of said each test probe (16) in the cavity (13).

11. The test system as claimed in claim 1, wherein the plurality of test probes lie along a single plane inside the measurement enclosure (11).

12. The test system of claim 1, wherein the positioning of the test probe is variable along a single plane.

* * * * *